United States Patent [19]
Kido et al.

[11] Patent Number: 5,945,785
[45] Date of Patent: Aug. 31, 1999

[54] POWER SOURCE DEVICE WITH MINIMIZED VARIATION IN CIRCUIT EFFICIENCY DUE TO VARIATION IN APPLIED VOLTAGE TO DRIVING TRANSFORMER

[75] Inventors: Hiroshi Kido; Yuji Kumagai; Shinji Makimura, all of Kadoma, Japan

[73] Assignee: Matsushita Electric Works, Ltd.

[21] Appl. No.: 08/834,826

[22] Filed: Apr. 11, 1997

[30] Foreign Application Priority Data

| Aug. 27, 1996 | [JP] | Japan | 8-225729 |
| Jan. 28, 1997 | [JP] | Japan | 9-013697 |
| Feb. 28, 1997 | [JP] | Japan | 9-013696 |

[51] Int. Cl.$^6$ .................................................. H05B 41/00
[52] U.S. Cl. .......................... 315/276; 315/278; 315/219; 315/248; 330/251
[58] Field of Search ..................... 315/276, 278, 315/219, 344, 248; 330/251, 276

[56] References Cited

U.S. PATENT DOCUMENTS

| 5,023,566 | 6/1991 | El-Hamamsy et al. | 330/251 |
| 5,030,889 | 7/1991 | El-Hamamsy et al. | 315/200 R |
| 5,306,986 | 4/1994 | Siao | 315/248 |
| 5,414,327 | 5/1995 | Reijnaerts | 315/219 |

*Primary Examiner*—Arnold Kinkead
*Attorney, Agent, or Firm*—Burns, Doane, Swecker & Mathis, L.L.P.

[57] ABSTRACT

A power source device includes a high frequency power source having a pair of switching elements and converting a DC voltage into an AC high frequency voltage to be supplied to a load, a driving transformer having, wound on a magnetic core, a primary winding and a pair of secondary windings connected respectively in series to each of control terminals of the pair of the switching elements, and a driving device for driving the two switching elements by applying a voltage to the primary winding of the driving transformer. The secondary windings are wound on the core to be separated in every turn at equal intervals and not to be intimately close to each other, for remarkable improvement in the degree of variability in the efficiency of circuit forming the power source device.

13 Claims, 8 Drawing Sheets

POWER SOURCE DEVICE WITH MINIMIZED VARIATION IN CIRCUIT EFFICIENCY DUE TO VARIATION IN APPLIED VOLTAGE TO DRIVING TRANSFORMER

BACKGROUND OF THE INVENTION

This invention relates to power source devices and, in particular, to a power source device in which two switching elements are connected in series for converting a DC voltage into an AC voltage to be supplied to a load.

The power source device of the kind referred to should find its utility when employed in, for example, discharge lamp lighting device and so on.

DESCRIPTION OF RELATED ART

There have been suggested such power source devices of the kind referred to as in the following.

In U.S. Pat. No. 5,023,566 to El Hamamsy et al., for example, the device comprises a main amplifier comprised of a so-called Class D amplifying circuit including field-effect transistor type switching elements as well as an inductor and a capacitor, and a driving transformer having primary and secondary windings and a magnetic core for transferring an output from a drive means to the main amplifier. In this case, a resistance load is connected to output ends of the main amplifier as a load, and a high frequency power source is constituted by the drive means, driving transformer and main amplifier as a load, so that a high frequency power can be supplied from this high frequency power source to the resistance load.

For the load, U.S. Pat. No. 5,414,327 to Reijnaerts discloses another arrangement employing an electrodeless discharge lamp, which arrangement comprises the electrodeless discharge lamp of a spherical glass bulb transparent or having a fluorescent material applied to its inner wall and containing as sealed therein such discharge gas of metallic vapor and the like as mercury and rare gas, a high frequency power supplying coil disposed closely along the lamp, and a high frequency power source for supplying a high frequency power to the high frequency power supplying coil. A high magnetic field is generated with the high frequency power supplying coil by supplying a high frequency current from the high frequency power source to the high frequency power supplying coil, and the high frequency power is supplied to the electrodeless discharge lamp, so that a high frequency plasma will be generated in the electrodeless discharge lamp to have ultraviolet rays or visible rays generated.

Another known power source device has been disclosed in U.S. Pat. No. 5,030,889 to El Hamamsy et al., in which primary winding of driving transformer is divided into two which are connected in series and are respectively wound on each of separate magnetic cores for driving switching elements, so that any interaction between secondary windings can be reduced for minimizing any distortion in current waveform, or a strict control desired with respect to relative phase and amplitude of gate driving signals as well as an avoidance of any distortion from a desired sinusoidal waveform can be performed. With this arrangement, however, the division of the driving transformer into two sections causes the two magnetic cores to be required, so as to cause a problem to arise in that required costs are increased and the weight of the power source device is increased. Further problem exists in that circuit pattern on the primary winding side is made longer so that the circuit operation is influenced by a parasitic inductance generated in such circuit pattern so as to become unstable, when the circuit is operated at such high frequency as, for example, 13.56 MHz.

Referring more concretely to an example of the drive means applied in the foregoing U.S. Pat. No. 5,023,566, further, the high frequency power source constitutes the drive means with an oscillation circuit employing a crystal oscillator and with a pre-amplifier comprising a so-called Class C amplifying circuit for amplifying an output of the oscillation circuit. Across the primary winding of the driving transformer, a variable condenser is connected in parallel, so that a voltage VGS across the gate and source of the pair of the switching elements forming the main amplifier may be adjusted by controlling the variable condenser, and the output of the high frequency power source can be made controllable. When a product IRF710 of IR is employed as the switching element, for example, the control voltage VGS across the gate and source will be substantially in a sinusoidal waveform, the peak value of which is set to be 10 to 15V. Here, a DC current source is employed as a power source of the main amplifier, and another DC power source is used as a power source of the drive means.

Further, in another known driving transformer, toroidal core is employed as the magnetic core, a primary winding and a pair of secondary windings are wound on the toroidal core, and the secondary windings wound adjacent to each other are made not to cross each other but to be close to each other, so as to be in a bifilar winding.

With the foregoing known art, a rate of change of the circuit efficiency η with respect to the value of the variable condenser is also enlarged. Therefore, it has been a problem that, even when the value of the variable condenser is initially set to render the circuit efficiency η to be the highest, the circuit efficiency η is remarkably lowered when a voltage occurring at the secondary winding is varied due to any variation with time or temperature characteristic of constituting parts.

Referring here to the reason why the circuit efficiency η is caused to remarkably vary due to the amplitude of the voltage occurring at the secondary winding, the particular voltage is equal to the across gate-and-source voltage VGS of the switching element. Assuming here that periods in which the voltage exceeds a gate threshold voltage $V_T$ of the pair of the switching elements of Class D amplifying circuit are $T_A$ and $T_B$, then they will be $T_A \approx T_B$.

At this time, the amplitude of the voltage occurring at the secondary winding is enlarged and this state of $T_A$ and $T_B$ continues long, so the dead-off time (the time for which the pair of the switching elements are concurrently OFF), the switching loss of these switching elements is increased, and the circuit loss in increased.

As the amplitude of the across gate-and-source voltage VSG is kept increased by enlarging the value of the variable condenser, therefore, the circuit efficiency η is caused to be deteriorated.

SUMMARY OF THE INVENTION

A primary object of the present invention is, therefore, to provide at a lower cost a power source device which can capable of overcoming the foregoing problems, minimizing the rate of change in the circuit efficiency η even upon variation in the voltage applied to the primary side of the driving transformer due to any characteristic change of the constituent parts, and also attaining dimensional minimization of the device.

According to the present invention, the above object can be realized by means of a power source device comprising a high frequency power source having a pair of switching elements connected in series and converting a DC voltage into an AC high frequency voltage for supplying it to a load; a driving transformer having a primary winding, a pair of secondary windings connected respectively in series to each control terminal of the pair of the switching elements, and a magnetic core on which the primary winding and the pair of the secondary windings are wound; and means for driving the pair of the switching elements by an application of a voltage to the primary winding of the driving transformer; wherein the secondary windings of the driving transformer are wound in a direction in which the degree of variability in ON time of the switching elements becomes smaller as compared with the degree of variability in the voltage applied to the primary winding in the driving transformer.

Other objects and advantages of the present invention shall become clear as the description of embodiments according to the present invention advances as detailed in the followings with reference to accompanying drawings.

While the present invention shall now be described in the followings with reference to the embodiments shown in the accompanying drawings, it should be appreciated that the intention is not to limit the invention only to these embodiments shown but rather to include all alterations, modifications and equivalent arrangements possible within the scope of appended claims.

EMBODIMENT 1

Figure 1:
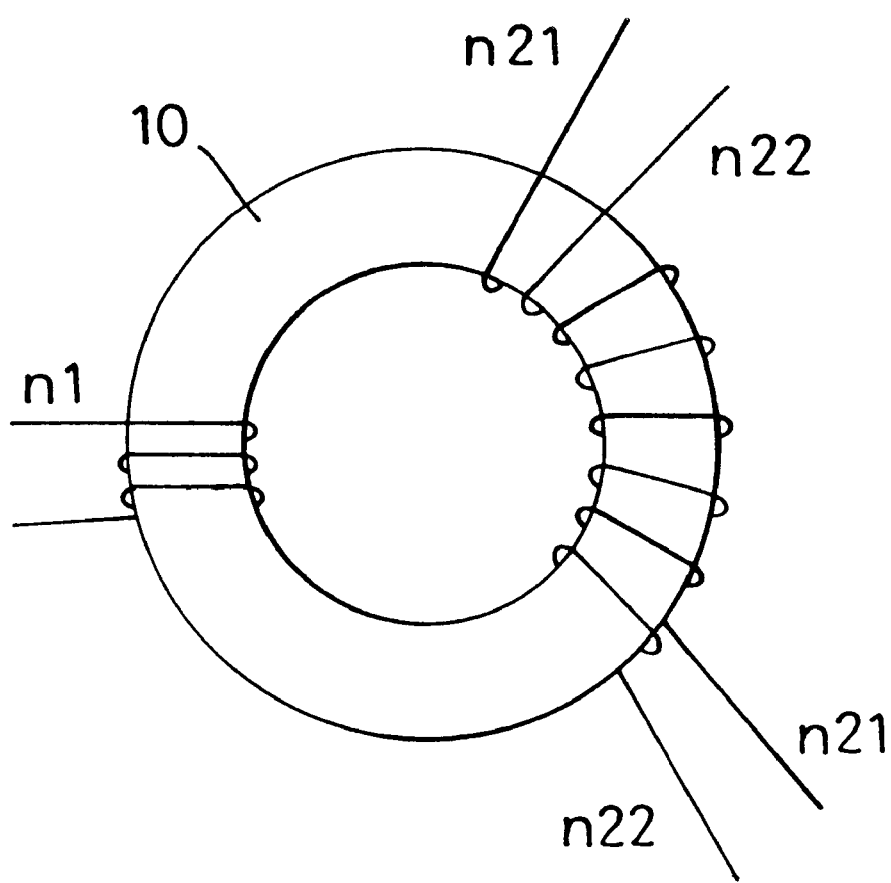
FIG. 1 is a schematic view of the driving transformer employed in the first embodiment of the power source device according to the present invention.

A driving transformer T employed in the first embodiment according to the present invention is shown schematically in FIG. 1, in which the driving transformer T employs a toroidal core, for example, as a magnetic core 10, a primary winding n1 and a pair of secondary windings n21 and n22 are wound on the toroidal core 10, and these secondary windings n21 and n22 adjacent to each other are wound in a bifilar winding so as not to intersect each other. At this time, in particular, the secondary windings n21 and n22 are wound as mutually separated at equal intervals so as not to be too close to each other, but to be remote from each other at every turn.

Figure 2:
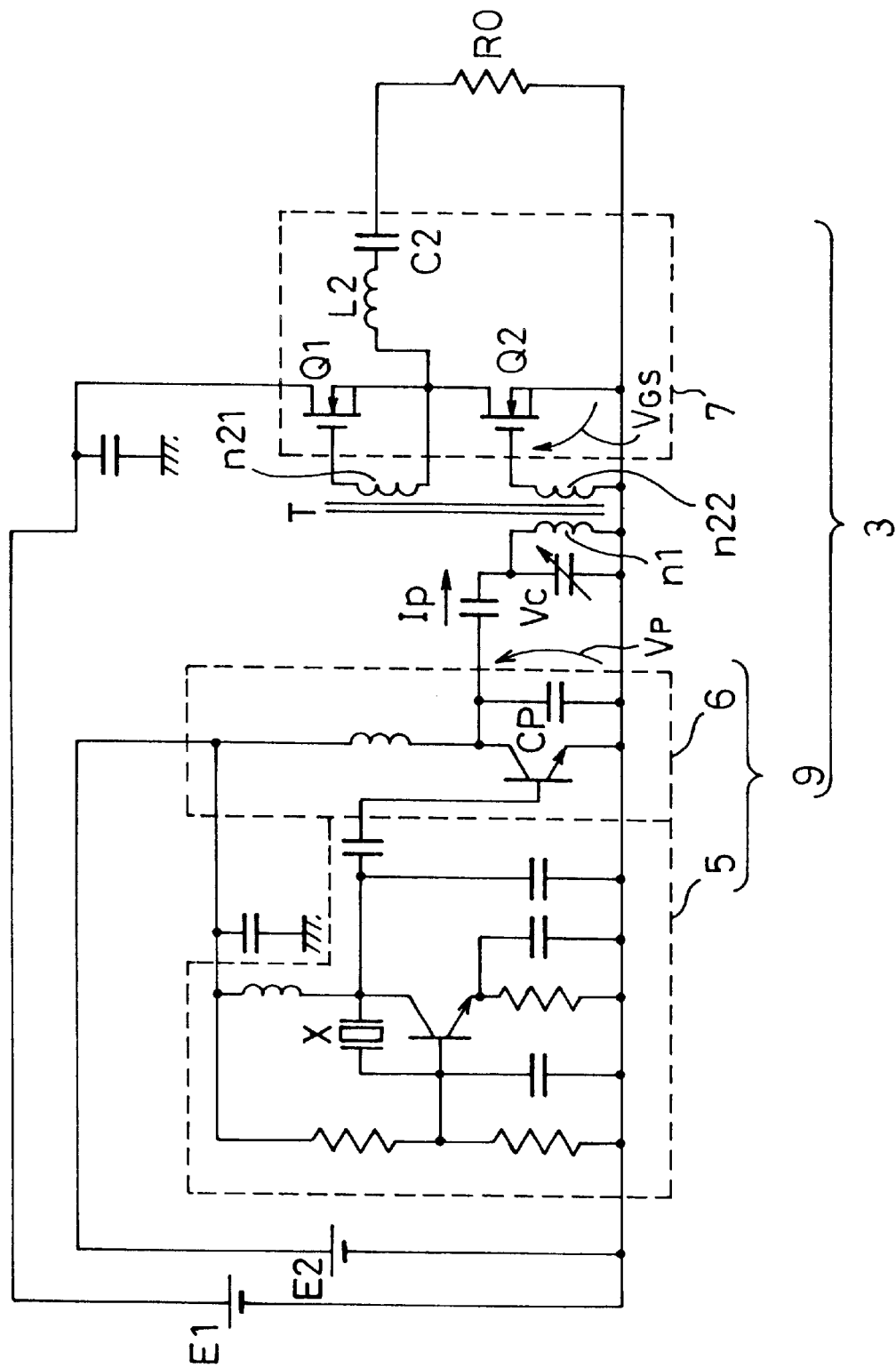
FIG. 2 is a circuit diagram showing a power source in the first embodiment.
Figure 3A:
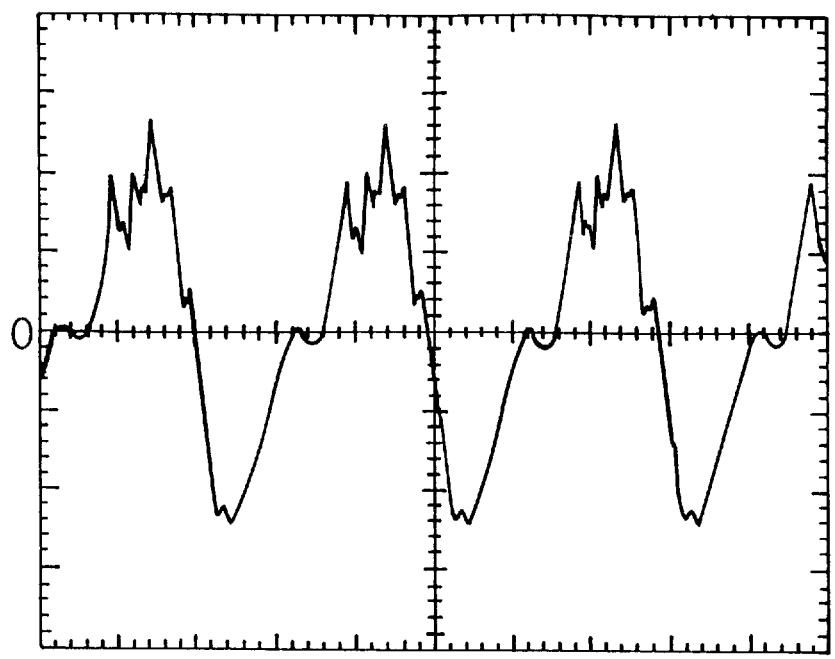
FIG. 3A is a waveform diagram of the voltage across the gate and source of the switching elements in the first embodiment.
Figure 3B:
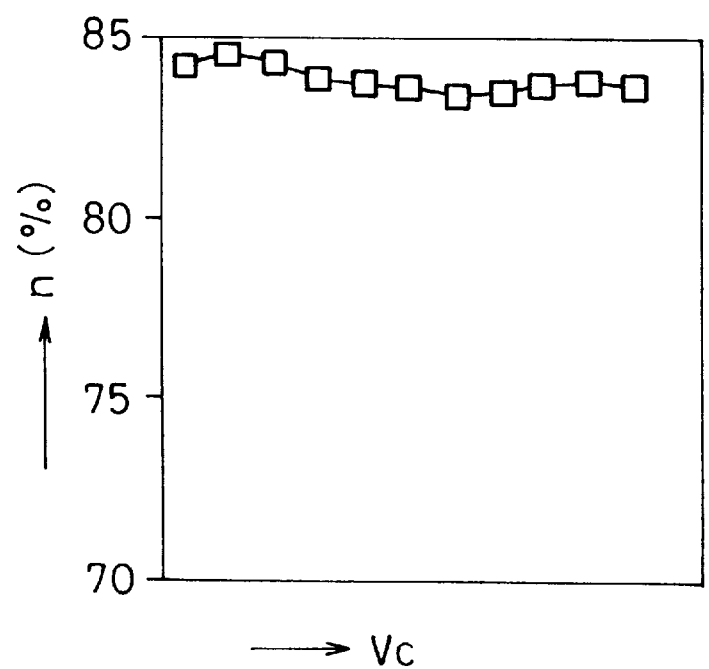
FIG. 3B is a characteristic diagram of the circuit efficiency with respect to the value of the variable condenser in the first embodiment.

Next, the operation shall be briefly described. A waveform of the voltage VGS across the gate and source of one switching element Q2 in the event when both of DC power sources E1 and E2 are made ON in the circuit of FIG. 2 is shown in FIG. 3A, a characteristic diagram of the circuit efficiency η of a high frequency source 3 with respect to a value of a variable condenser VC is shown in FIG. 3B. From this FIG. 3B, it is seen that the circuit efficiency η is held at about 84% even when the value of the variable condenser VC (or the voltage VGS across the gate and source) varies, and no remarkable deterioration in the circuit efficiency η can be seen as in known devices. That is, the circuit efficiency η does not vary remarkably even when the voltage applied to the primary winding n1 of the driving transformer T varies due to a change in the value of the variable condenser.

Referring to the absence of any remarkable variation in the circuit efficiency η, as will be clear from FIG. 3A, the waveform of the across gate-and-source voltage VGS involves a distortion of waveform around zero V upon rising from negative voltage. This is because the line capacity of the respective secondary windings n21 n22 has been reduced due to such mutually remote winding at every turn of the secondary windings n21 and n22 so as not to be too close to each other as shown in FIG. 1, and because the line capacity between the primary winding n1 and the secondary windings n21 and n22 has been increased due to a reduction in the distance between the primary winding and the secondary windings n21 and n22. With the occurrence of such distortion in the waveform, the ON width or dead-OFF time of the switching elements Q1 and Q2 does not vary remarkably, with an action of the waveform distortion, even when the value of the variable condenser VC varies. Accordingly, in view that the dead-OFF time and the loss at the switching elements Q1 and Q2 correlate mutually, it is considered that the ON width of the switching elements Q1 and Q2 does not vary remarkably and the circuit efficiency η does not vary remarkably, even when the voltage applied to the primary winding n1 of the driving transformer T due to the change in the value of the variable condenser VC to cause the amplitude of the voltage occurring at the secondary windings (the voltage across the gate and source of the switching elements Q1 and Q2) to be varied.

EMBODIMENT 2

Figure 4:
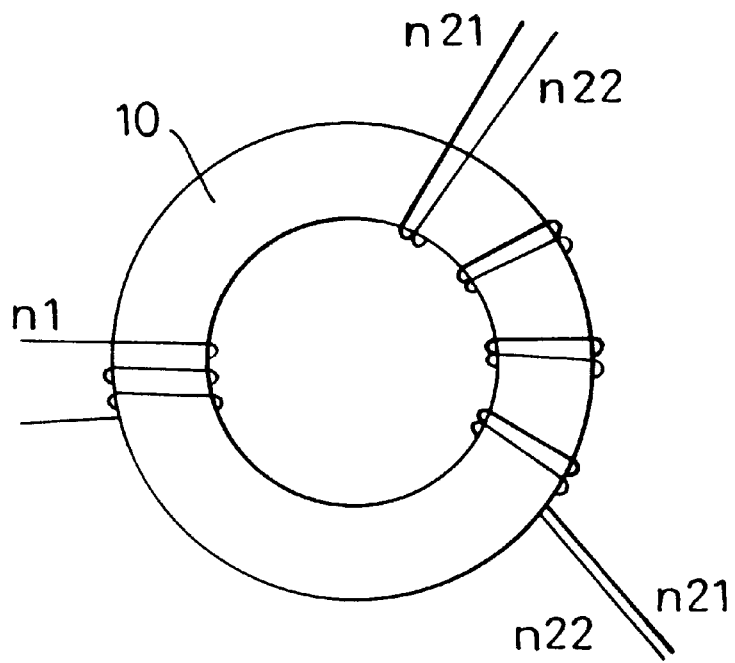
FIG. 4 is a schematic view of the driving transformer employed in a second embodiment of the present invention.
Figure 5:
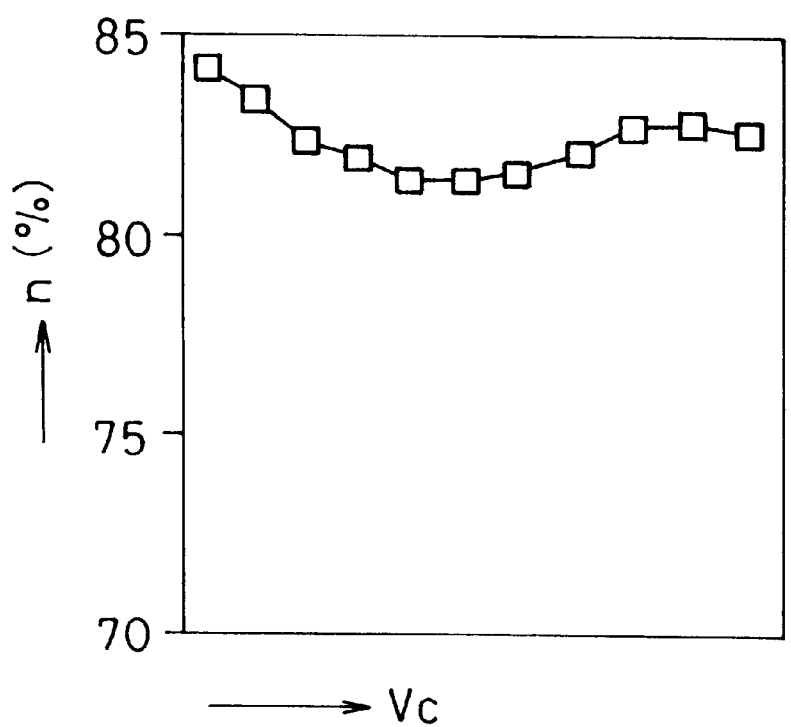
FIG. 5 is a characteristic diagram of the circuit efficiency of the second embodiment.

A second embodiment of the present invention is shown in FIG. 4 as a schematic view, in which a difference from the first embodiment shown in FIG. 1 is that the secondary windings n21 and n22 are so wound as to be close to each other but not in mutually contact, and all other arrangements and functions are the same as those in the first embodiment. Referring next to the operation of this second embodiment briefly, a characteristic diagram of the circuit efficiency η with respect to the value of the variable condenser VC in the case when both of the DC power sources E1 and E2 are made ON is shown in FIG. 5. While the circuit efficiency η is slightly lowered (=the smallest value about 82%) in contrast to the first embodiment shown in FIG. 3B, the decrease in the circuit efficiency η is made less, as shown in FIG. 5.

This is considered to be because the distance between the secondary windings n21 and n22 is decreased and the line capacity is made larger.

EMBODIMENT 3

Figure 6:
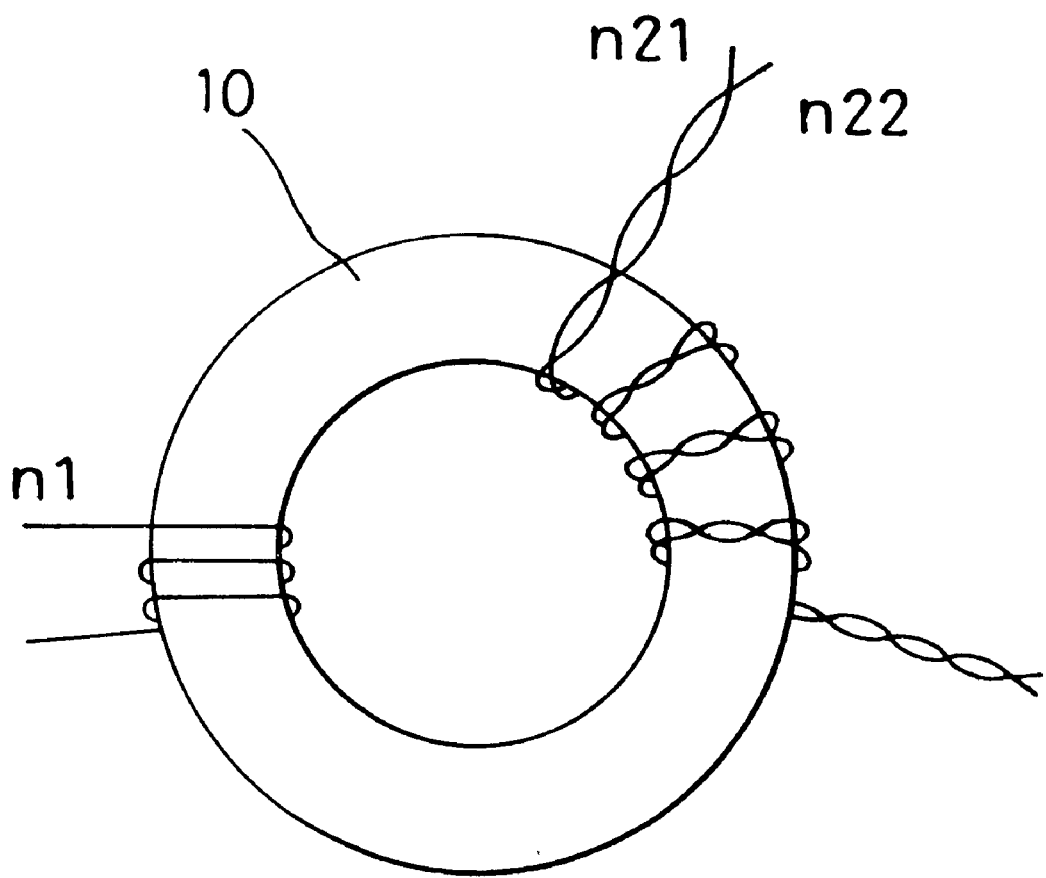
FIG. 6 is a schematic view showing the driving transformer employed in a fifth embodiment of the present invention.

In a third embodiment of the present invention, such arrangement as follows is employed. That is, in the driving transformer T of the foregoing first and second embodiments, the secondary windings n21 and n22 are mutually twisted as shown in FIG. 6 to be wound into the bifilar winding on the toroidal core 10 and to be close to each other, whereby the magnetic coupling between the secondary windings n21 and n22 is further strengthened, the phase difference of the across gate-and-source voltage VGS between the switching elements Q1 and Q2 can be corrected substantially to be 180 degrees, and the switching loss can be lowered.

EMBODIMENT 4

A fourth embodiment of the present invention employs such arrangement as follows. That is, in the present embodiment, the primary winding n1 and each of the secondary windings n21 and n22 are disposed substantially mutually in symmetry, with the center of the toroidal core 10 made as an axis. This can strengthen the magnetic coupling of the primary winding n1 and each of the secondary windings n21 and n22 of the driving transformer T.

EMBODIMENT 5

A fifth embodiment of the present invention employs such arrangement as follows. That is, in the present embodiment, the primary winding n1 of the first to fourth embodiments is wound on the toroidal core 10 at a high density to render the occupying area on the core to be the smallest. With the high density winding of the primary winding n1, any leakage of magnetic flux at the primary winding n1 can be minimized, and the power can be effectively transferred to the secondary windings n21 and n22. In an event when an electrodeless discharge lamp 1 is employed as the load, it is required to supply a great deal of the high frequency power to a high frequency power supplying coil 2 upon starting the electrodeless discharge lamp 1, whereas an output of a pre-amplifier 6 is enabled to be effectively transferred to the main amplifier 7, so that the startability of such load as the electrodeless discharge lamp 1 can be elevated.

Further, while in the foregoing first to fifth embodiments the across gate-and-source voltage VGS has been referred to as that of the switching element Q2, this may be replaced by the across gate-and-source voltage of the other switching element Q1. Further, any other magnetic core than the toroidal core may be employed, and either a core of iron carbonyls or Ni—Zn series ferrite core may be effectively employed as the magnetic core.

EMBODIMENT 6

A sixth embodiment of the present invention is of the same circuit arrangement as that of FIG. 2, but is different only in the operation, which shall be briefly described with reference to FIGS. 7–12.

Figure 7:
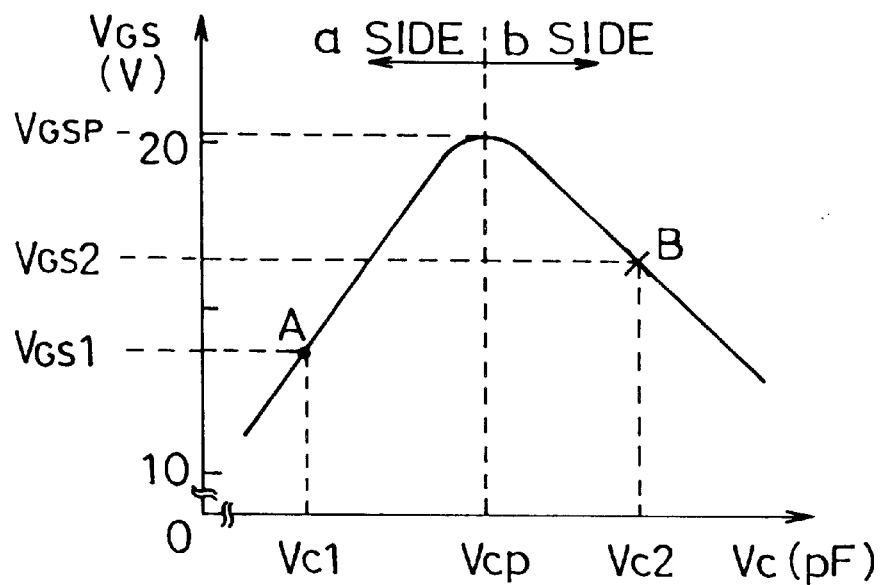
FIG. 7 is a characteristic diagram of the voltage across the gate and source with respect to the value of variable condenser in a sixth embodiment of the present invention.

The characteristic diagrams shown in FIGS. 7–12 are of the case employing the resistance load Ro as has been described, a voltage Vp denotes a voltage across a capacitor Cp connected in parallel to output ends of the pre-amplifier 6, that is, an output voltage of the pre-amplifier 6, and a current Ip denotes an output current of the pre-amplifier 6. Further, the across gate-and-source voltage VGS shown in FIG. 7 is one attained when the DC power source E2 only is connected, and this is because, after connection of the DC power source E1, a high frequency ripple is caused to superposed on the across gate-and-source voltage VGS, so that any amplitude variation of the across gate-and-source voltage VGS upon variation in the variable condenser VC becomes difficult to read.

The operation shall be described briefly with reference to FIGS. 7–12.

Figure 8:
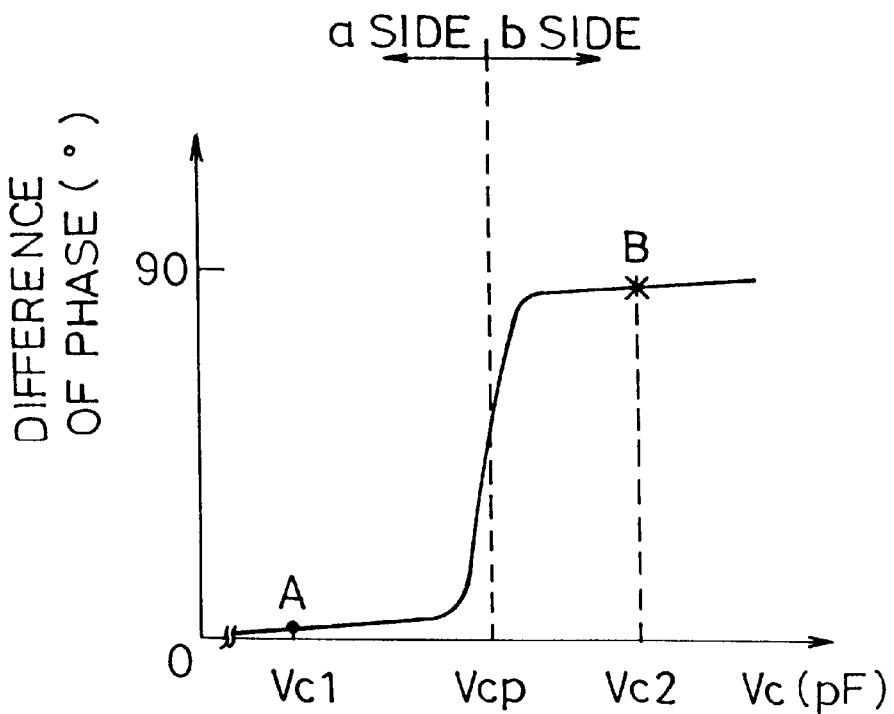
FIG. 8 is a phase characteristic diagram with respect to the value of the variable condenser used in the sixth embodiment of the present invention.
Figure 9:
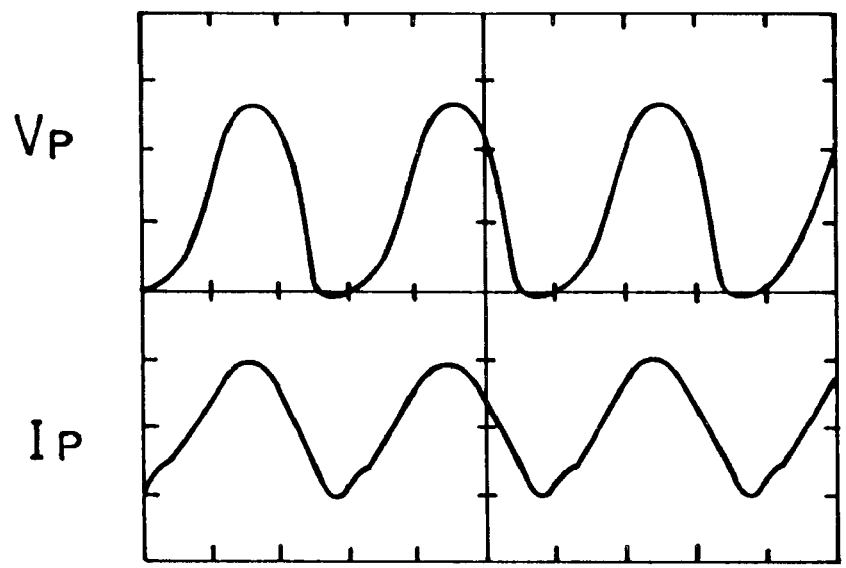
FIGS. 9 and 10 are waveform diagrams respectively for the phase difference between the voltage and the current.
Figure 10:
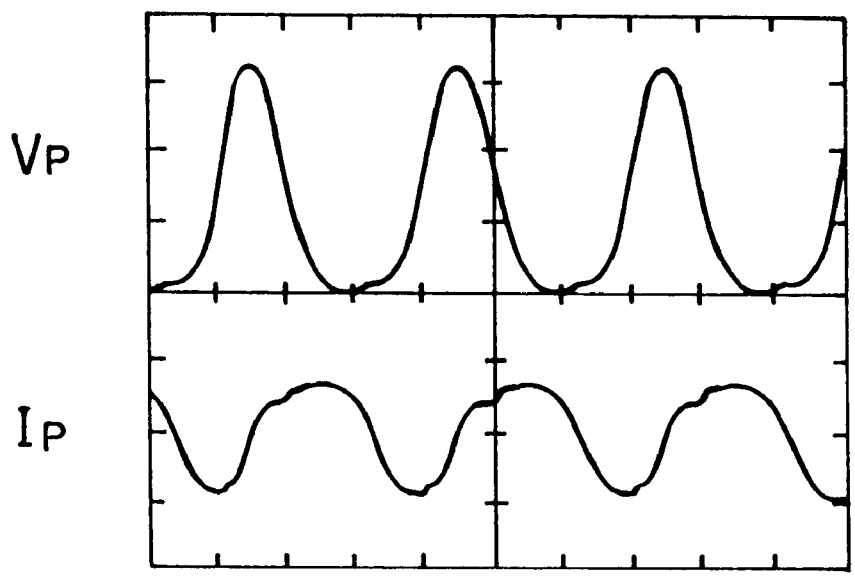
Figure 11:
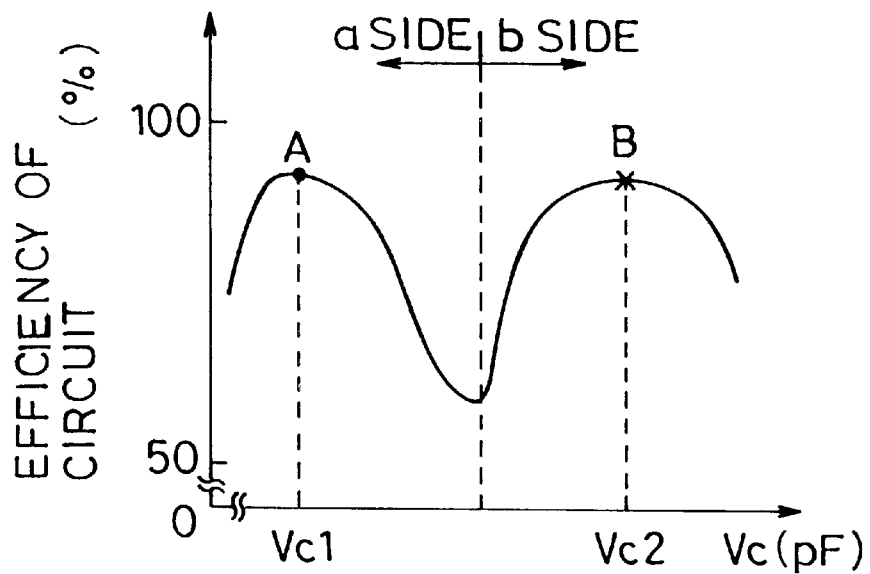
FIG. 11 is a characteristic diagram of the circuit efficiency of the sixth embodiment.
Figure 12:
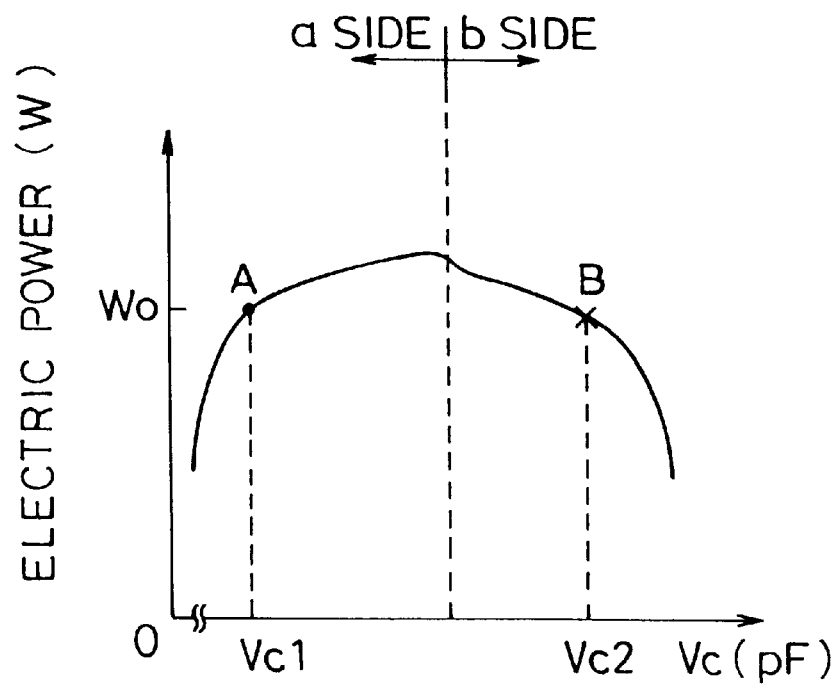
FIG. 12 is a characteristic diagram of the variation in output power of the sixth embodiment.

As shown in FIG. 7, the across gate-and-source voltage VGS varies, with respect to variation of the value of the variable condenser VC, along substantially a parabolic curve having a peak value of VGSP. This shows that a resonance has occurred between the variable condenser VC and the driving transformer T. Assuming that a value of the variable condenser VC which enables the peak value VGSp of the across gate-and-source voltage VGS to be obtained is VCp, and that an event where the variable condenser is VC is of a value smaller than VCp is made a-side while an event where the VC value is larger than VCp, then a value of the variable condenser VC that can obtain one across gate-and-source voltage VGS is present on both of the a-side and b-side shown in FIG. 7. Further, as shown in FIG. 8, the phase difference between the voltage Vp and the current Ip varies substantially in equiphase in the event where the value of the variable condenser VC is smaller than VCp with VCp as a boundary (FIG. 9) or varies as deviated by about 90 degrees in the event where the value of the variable condenser VC is larger than VCp (FIG. 10). As shown in FIG. 11, the circuit efficiency of the high frequency power source 3 has the peak value on both of the a-side and b-side. As shown in FIG. 12, the value of the variable condenser VC that can obtain one output voltage of the high frequency power source 3 is present on both of the a-side and b-side of FIG. 12. Here, output voltage of the high frequency power source 3 which allows that largest efficiency of the power source 3 is assumed to be Wo. Further, while not shown here, an input current 12 to the driving means 9 increases on a-side as the value of the variable condenser VC increases, but decreases on b-side as the value of VC increases.

As will be clear from FIGS. 11 and 12, the value of the variable condenser VC which can render the output power of the high frequency power source 3 to be Wo is present on both of the a-side and b-side of FIG. 12, and this value of the variable condenser VC is made to be VC1 and VC2 (VC1<VC2). The values of the across gate-and-source voltage VGS corresponding to the values VC1 and VC2 are present on both of the a-side and b-side shown in FIG. 7, and corresponding values of the across gate-and-source voltage VGS are made to be VGS1 and VGS2.

While the characteristic diagrams of FIGS. 7–12 are of the case employing the resistance load Ro, the electrodeless discharge lamp 1 and matching circuit 4 are now provided in place of the resistance load Ro for starting the electrodeless discharge lamp 1, in which event the starting of the lamp 1 is possible on the a-side shown in FIGS. 7–12 but is extremely difficult on the b-side.

This is caused by the fact that, when the amplitude of the across gate-and-source voltage VGS is compared between a case where the DC power source E2 only is made ON in no-load state (state without the electrodeless discharge lamp 1) and another case where both of the DC power sources E1 and E2 are made ON, the amplitude of the voltage VGS excessively decreases on the b-side more than that on the a-side as shown in FIGS. 7–12. For example, in the event where the DC power source E2 only was made ON, the across gate-and-source voltage VGS was 15V, whereas, in the event where only DC power source E2 was made ON in the state where the resistor of 47Ω was connected across the gate and source of the switching elements Q1 and Q2, the voltage VGS has decreased to 12V on the a-side but to 7V on the b-side of FIGS. 7–12.

That is, it should be appreciated that the variation in the startability of the electrodeless discharge lamp between the a-side and b-side shown in FIGS. 7–12 results from the variation in impedance on the load side as seen from the driving means 9 between the ON state and OFF state of the DC power source E1.

Since the across gate-and-source voltage VGS is weak with respect to the fluctuation in the load on the b-side shown in FIGS. 7–12, it is difficult to obtain the required voltage VGS for starting the electrodeless discharge lamp 1 and, consequently, it becomes difficult to supply to the electrodeless discharge lamp 1 through the matching circuit 4 and high frequency power supplying coil 2 from the main amplifier 7 any sufficient power for starting the particular lamp 1. On the a-side of FIGS. 7–12, on the other hand, the voltage is strong with respect to the load fluctuation, so that the across gate-and-source voltage VGS required for starting the electrodeless discharge lamp 1 can be obtained, whereby the sufficient power for starting the lamp 1 can be supplied from the main amplifier 7 through the matching circuit 4 and high frequency power supplying coil 2 to the lamp 1, and it is eventually enabled to stably light the electrodeless discharge lamp 1.

The above is also clear from the fact that, as the voltage Vp and current Ip vary substantially in equiphase on the a-side as shown in FIG. 8, the effective power can be sufficiently supplied from the driving means 9 to the main amplifier 7, whereas, as the voltage Vp and current Ip vary as deviated by about 90 degrees on the b-side, much of reactive power is supplied from the driving means 9 to the main amplifier 7.

Hence, it becomes possible to improve the startability of the electrodeless discharge lamp 1 by rendering the value of the variable capacitor VC to be on the a-side shown in FIGS. 7–12, and also possible to improve the efficiency of the lamp 1 by means of attaining VC=VC1.

It should be readily appreciated that, in the above case, an inductor of variable inductance may be employed instead of the variable condenser VC, in which event, too, the startability as well as the efficiency of the electrodeless discharge lamp 1 can be improved by rendering the inductance value to be on the a-side shown in FIGS. 7–12.

What is claimed is:

1. A power source device comprising a high frequency power source having a pair of switching elements connected in series and converting a DC voltage into an AC high frequency voltage for being supplied to a load;
    a driving transformer having a primary winding, a pair of secondary windings connected respectively in series to each control terminal of the pair of the switching elements, and a magnetic core on which the primary winding and the pair of the secondary windings are wound; and
    means for driving the pair of the switching elements by an application of a voltage to the primary winding of the driving transformer;
    wherein said pair of secondary windings of the driving transformer are wound in a bifilar winding on the magnetic core to be mutually remote at every turn thereof, whereby the line capacity of both secondary windings is reduced, and the degree of variability in ON time of the switching elements becomes smaller as compared with the degree of variability in the voltage applied to the primary winding in the driving transformer.

2. The device according to claim 1 wherein said secondary windings of said driving transformer are wound on said core to render the ON time of said switching elements substantially to be in a fixed direction even upon fluctuation in the effective value of the voltage applied to the primary winding of the driving transformer.

3. The device according to claim 1 wherein said pair of secondary windings are wound at regular intervals in every turn of the windings.

4. The device according to claim 1 wherein said pair of secondary windings are wound at regular intervals through all turns of the windings.

5. The device according to claim 1 wherein said pair of said secondary windings are wound mutually in non-contact.

6. The device according to claim 1 wherein said primary and secondary windings of the driving transformer are wound in symmetrical relationship to each other about a center axis of the magnetic core.

7. The device according to claim 1 wherein said primary winding of the driving transformer is wound to be intimately close at every turn at least on an inner periphery side of said magnetic core.

8. The device according to claim 1 wherein said magnetic core of the driving transformer is a toroidal core.

9. The device according to claim 1 wherein said driving means drives said switching elements for separate excitation.

10. The device according to claim 1 wherein said high frequency power source is a Class D amplifying circuit.

11. The device according to claim 1 wherein said load includes at least an electrodeless discharge lamp.

12. A power device for use in lighting an electrodeless discharge lamp, the device comprising an electrodeless discharge lamp of a glass bulb in which a discharge gas is sealed, a high frequency power supplying coil disposed closely along the electrodeless discharge lamp, a high frequency power source for receiving a source power from a DC power source and supplying a high frequency power to said high frequency power supplying coil, and a matching circuit for matching the impedance of both of the high frequency power supplying coil and the high frequency power source;
    said high frequency power source comprising a Class D amplifying circuit including a pair of switching elements for supplying the high frequency power to the high frequency power supplying coil, a driving transformer including primary and secondary windings and connecting said secondary winding across a control terminal of said pair of switching elements, means for driving the pair of switching elements by applying a voltage to the primary winding of the driving transformer, and a variable condenser connected in parallel to the primary winding of the driving transformer and also in parallel to output ends of said driving transformer and having a capacitance value set for varying a voltage across the control terminal of the pair of switching elements, said capacitance value of the variable condenser being smaller than a value at which the voltage across the control terminals of the pair of switching elements can be the largest.

13. A power source device comprising a high frequency power source having a pair of switching elements connected in series and converting a DC voltage into an AC high frequency voltage for being supplied to a load;
    a driving transformer having a primary winding, a pair of secondary windings connected respectively in series to each control terminal of the pair of the switching elements, and a magnetic core on which the primary winding and the pair of the secondary windings are wound; and means for driving the pair of the switching elements by an application of a voltage to the primary winding of the driving transformer;

wherein said pair of secondary windings of the driving transformer are mutually twisted and wound in a bifilar winding on the magnetic core to form turns of the twisted pair of secondary windings, the respective turns being remote from one another, whereby the line capacity of both secondary windings is reduced, and the degree of variability in ON time of the switching elements becomes smaller as compared with the degree of variability in the voltage applied to the primary winding in the driving transformer.

* * * * *